United States Patent
Yamagishi et al.

(10) Patent No.: US 6,500,690 B1
(45) Date of Patent: Dec. 31, 2002

(54) METHOD OF PRODUCING A THIN-FILM PHOTOVOLTAIC DEVICE

(75) Inventors: Hideo Yamagishi, Kyoto; Hitoshi Nishio; Takayuki Suzuki, both of Shiga, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/536,092

(22) Filed: Mar. 24, 2000

(30) Foreign Application Priority Data

Oct. 27, 1999 (JP) .......................................... 11-305532
Nov. 19, 1999 (JP) .......................................... 11-330136
Jan. 26, 2000 (JP) ...................................... 2000-016940

(51) Int. Cl.$^7$ ........................ H01L 31/04; H01L 21/204
(52) U.S. Cl. .......................................... 438/57; 438/98
(58) Field of Search .............................. 438/57, 85, 97, 438/98; 204/192.27, 192.29; 136/256, 258; 257/458, 461

(56) References Cited

U.S. PATENT DOCUMENTS

| | | | |
|---|---|---|---|
| 5,136,351 | * 8/1992 | Inoue et al. | 136/256 |
| 5,180,434 | * 1/1993 | DiDio et al. | 118/723 |
| 5,612,229 | * 3/1997 | Yoshida | 257/436 |
| 5,711,824 | * 1/1998 | Shinohara et al. | 136/259 |
| 5,828,117 | * 10/1998 | Kondo et al. | 136/258 |
| 5,851,365 | * 12/1998 | Scoby | 204/192.12 |
| 6,040,521 | * 3/2000 | Kushiya et al. | 136/265 |
| 6,110,328 | * 8/2000 | Shimizu et al. | 204/192.12 |
| 6,136,162 | * 10/2000 | Shiozaki et al. | 204/192.29 |
| 6,140,570 | * 10/2000 | Kariya | 136/256 |
| 6,187,150 | * 2/2001 | Yoshimi et al. | 204/192.29 |

FOREIGN PATENT DOCUMENTS

| | | |
|---|---|---|
| JO | 8-107225 | 4/1996 |
| JP | 59-194479 | 11/1984 |
| JP | 3-99477 | 4/1991 |
| JP | 4-282871 | 9/1992 |
| JP | 5-13790 | 1/1993 |
| JP | 7-263731 | 10/1995 |
| JP | 8-32094 | 2/1996 |
| JP | 9-255491 | 9/1997 |

* cited by examiner

Primary Examiner—Savitri Mulpuri
(74) Attorney, Agent, or Firm—Hogan & Hartson, LLP

(57) ABSTRACT

A method is provided for producing a thin-film photovoltaic device which has a rear electrode including a transparent conductive rear layer and a light-reflective metallic layer. In forming the light-reflective metallic layer, a first plasma region including fine particles of zinc oxide and a second plasma region including fine particles of silver are formed in a chamber at a sputtering gas pressure of about 0.1 to about 0.27 Pa. Then, the substrate is passed over the first and second plasma regions formed in the chamber to form a bonding layer comprising the zinc oxide and a light-reflective metallic layer comprising the silver, thereby providing the rear electrode having the transparent conductive rear layer, the bonding layer and the light-reflective metallic layer.

8 Claims, 2 Drawing Sheets

METHOD OF PRODUCING A THIN-FILM PHOTOVOLTAIC DEVICE

CROSS-REFERENCE TO RELATED APPLICATIONS

This application is based upon and claims the benefit of priority from the prior Japanese Patent Applications No. 11-305532, filed Oct. 27, 1999; No. 11-330136, filed Nov. 19, 1999; and No. 2000-016940, filed Jan. 26, 2000, the entire contents of which are incorporated herein by reference.

BACKGROUND OF THE INVENTION

The present invention relates to a method of producing a thin-film photovoltaic device, and more particularly to a method of producing a thin-film photovoltaic device having a rear electrode excellent in strength of bonding with a photovoltaic conversion unit.

Recently, thin-film photovoltaic devices having a semiconductor thin film as a photovoltaic conversion film, such as solar cells, have been developed briskly. Generally, such thin-film photovoltaic devices have, on an insulating substrate, a rear electrode, a thin-film photovoltaic conversion unit having a pin or nip junction structure and provided in front of the rear electrode, and a transparent front electrode provided in front of the photovoltaic conversion unit. These thin-film photovoltaic devices have been expected to find applications in various fields such as optical sensors, in addition to solar cells.

Various improvements have been proposed to enhance the photovoltaic conversion amount of the thin-film photovoltaic devices. For example, it has been proposed to form the rear electrode from silver. Silver has a very high light-reflectivity. The light entering the photovoltaic conversion unit repeats reflection between the high light-reflectivity silver rear electrode and the transparent front electrode. The repeated reflection increases light absorption by the photovoltaic conversion layer, thus enhancing the photovoltaic conversion amount.

Further, a number of the photovoltaic devices have recently been proposed in which a transparent electrically conductive layer made of, e.g., zinc oxide (hereinafter referred to as transparent conductive rear layer) is disposed between a light-reflective metallic layer and a silicon-based photovoltaic conversion unit (see, for example, Jpn. Pat. Appln. KOKAI Publication No. 3-99477, and Jpn. Pat. Appln. KOKAI Publication No. 7-263731). By disposing the transparent conductive rear layer between the light-reflective metallic layer of the rear electrode and the photovoltaic conversion unit, the thermal strain, which may be caused by a difference in thermal expansion coefficient between them, is alleviated, and the diffusion of the metal atoms into the silicon-based photovoltaic conversion unit is prevented. As a result, not only the yield and reliability of the photovoltaic device products are increased, but also the optical sensitivity of the devices is enhanced, leading to improved photovoltaic characteristics.

However, silver has an inferior bonding strength with respect to thin-film semiconductors and ceramics. The bonding strength of silver is not so great that silver can be practically used as the material of the rear electrode in the thin-film photovoltaic devices. As described above, if the transparent conductive rear layer is provided between the silver rear electrode and the photovoltaic conversion unit, the bonding strength may be slightly increased. However, such an increase in the bonding strength is not practically sufficient at all, and still the above-noted effects, which the transparent conductive rear layer inherently has, cannot be utilized sufficiently.

BRIEF SUMMARY OF THE INVENTION

Accordingly, an object of the present invention is to provide a method of producing a thin-film photovoltaic device having a silver-based rear electrode excellent in bonding strength with respect to the transparent conductive rear layer.

The present inventors have conducted extensive studies in an attempt to achieve the above-noted object, during which they have paid attention to a technique disclosed in Jpn. Pat. Appln. KOKAI Publication No. 8-107225 filed by the assignee of the present application. According to this technique, firstly, a transparent electrode layer, a thin-film semiconductor layer and a first transparent conductive metallic compound layer are successively formed on an insulating transparent substrate. Then, the substrate is passed first over a first plasma region of transparent conductive metallic compound and then a second plasma region of metal, which are formed in a sputter chamber. As a result, a second transparent conductive metallic compound layer and a metal layer are formed on the first transparent conductive metallic compound layer. The first transparent conductive metallic compound layer and the metallic layer are bonded with each other firmly through the second transparent conductive metallic compound layer, thus forming an integral rear electrode.

The present inventors have studied this technique, and found out that (1) if silver is selected as the material of the metal layer, zinc oxide is optimum as the material of the first transparent conductive metallic compound layer in view of bondability with silver, (2) zinc oxide is also optimum as the material of the second transparent conductive metallic compound layer which acts as a bonding layer, and (3) more importantly, a pressure inside the sputter chamber during forming the zinc oxide layer and the silver layer is closely related to the bonding strength between the zinc oxide layer and the silver layer. The present invention is based on these findings.

According to the present invention, there is provided a method of producing a thin-film photovoltaic device which has a rear electrode including a transparent conductive rear layer comprising zinc oxide, and a light-reflective metallic layer comprising silver and provided in the rear of the conductive rear layer. The method according to the invention comprises the steps of forming, on a substrate, a transparent front electrode, a thin-film photovoltaic conversion unit provided in the rear of the front electrode, and the conductive rear layer provided in the rear of the photovoltaic conversion unit. In forming the light-reflective metallic layer, a first plasma region comprising fine particles of zinc oxide and a second plasma region comprising fine particles of silver are formed in a chamber at a sputtering gas pressure of about 0.1 to about 0.27 Pa. Then, the substrate is passed over the first and second plasma regions formed in the chamber to form a bonding layer comprising the zinc oxide and a light-reflective metallic layer comprising the silver, thereby providing the rear electrode comprising the transparent conductive rear layer, the bonding layer and the light-reflective metallic layer.

Where a thin-film photovoltaic device having a thin-film photovoltaic conversion unit of a pin junction structure is produced according to the present invention, the transparent front electrode, thin-film photovoltaic conversion unit and transparent conductive rear layer are formed successively on the substrate, and then the substrate is passed first over the first plasma region and then over the second plasma region to form the bonding layer and the light-reflective metallic layer successively over the transparent conductive rear layer.

Where a thin-film photovoltaic device having a thin-film photovoltaic conversion unit of a nip junction structure is produced according to the present invention, the substrate is passed first over the second plasma region and then over the first plasma region to form the light-reflective metallic layer and the bonding layer on the substrate, and thereafter the transparent conductive rear layer, thin-film photovoltaic conversion unit and transparent front electrode are formed successively over the light-reflective metallic layer.

Preferably, the first plasma region is formed by applying a discharge power to a zinc oxide sputter target which may contain a dopant, while the second plasma region is formed by applying a discharge power to a silver sputter target. In such a case, it is preferred that the power density of the discharge power applied to the zinc oxide sputter target is about 0.1 to 4 W/cm$^2$, and the power density of the discharge power applied to the silver target is about 1 to about 20 W/cm$^2$.

In the present invention, the first plasma region and the second plasma region may be formed such that they partially overlap each other to such an extent that the reflectivity of the light-reflective metallic layer formed at the second plasma region is not substantially decreased.

In a preferred embodiment, the zinc oxide-based transparent conductive rear layer is formed by sputtering a zinc oxide target at a temperature of 150° C. or more and a sputtering gas pressure of 1 Pa or more.

In another preferred embodiment, the thin-film photovoltaic conversion unit has an n-type semiconductor layer composed of silicon and containing phosphorus, as an impurity, in an amount of 2 to 8 atomic percent based on the silicon, and the transparent conductive rear layer is composed of zinc oxide and contains aluminum in an amount of 1 to 5% by weight.

In this specification, the term "front" refers to a light incident side of the device, while the term "rear" refers to the opposite side of the device. Further, the terms "nip junction structure" and "pin junction structure" refer to the order of a p-type semiconductor layer, an i-type semiconductor layer and an n-type semiconductor layer from the substrate. More specifically, the nip junction structure is a structure having an n-type semiconductor layer, an i-type semiconductor layer and a p-type semiconductor layer which are disposed in this order on the substrate. On the other hand, the pin junction structure is a structure having a p-type semiconductor layer, an i-type semiconductor layer and an n-type semiconductor layer in this order on the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
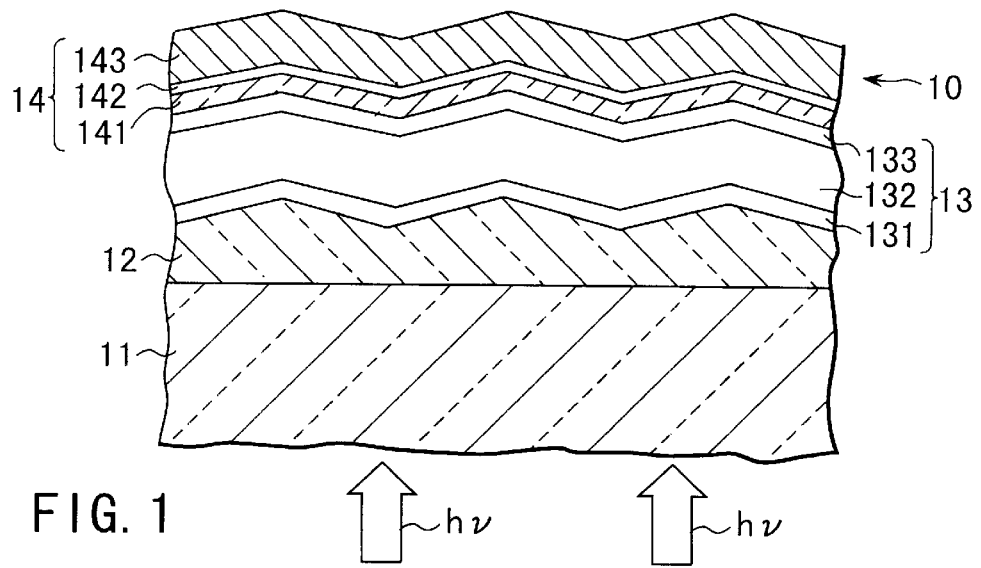
FIG. 1 is a schematic sectional view showing an example of a thin-film photovoltaic device produced according to a first embodiment of the present invention.

A first embodiment of the present invention concerns a method of producing a thin-film photovoltaic device provided with a thin-film photovoltaic conversion unit having a pin junction structure. FIG. 1 shows an example of the thin-film photovoltaic device 10 produced according to the first embodiment of the invention. This thin-film photovoltaic device 10 has, successively formed on an insulating substrate 11, a transparent front electrode 12, a thin-film photovoltaic conversion unit 13 and a rear electrode 14. The thin-film photovoltaic conversion unit 13 is usually composed of non-single crystal semiconductor, particularly silicon.

The substrate 11 may be formed of a transparent insulating material including a heat resistant plastic film such as polyethylene terephtalate (PET) or polyimide, ceramics, and a low melting cheap glass. Further, use may be made of a glass substrate whose surface is coated with silicon oxide ($SiO_2$) as an ion barrier film.

The transparent front electrode 12 is provided on the substrate 11. The transparent front electrode 12 is formed of a transparent electrically conductive material, particularly a transparent conductive oxide material, and may be of a single layer structure or multi-layer structure. Preferably, the transparent front electrode 12 is composed of a transparent conductive oxide selected from indium tin oxide (ITO), tin oxide ($SnO_2$), zinc oxide (ZnO) and a mixture thereof. Of these, ITO is preferred in view of electrical conductivity and light transmission, while tin oxide is particularly preferred in view of light transmission and chemical stability. These transparent conductive oxide materials may be doped with fluorine.

The transparent front electrode 12 can be formed by a vapor-phase deposition technique, well known per se in the art, such as vacuum deposition, CVD, or sputtering.

Desirably, the transparent front electrode 12 has an uneven or jagged surface structure (textured surface structure) as shown in FIG. 1, though it may have a flat or even surface. The vertical distance between the peak and the bottom in this uneven surface structure is desirably 10 to 100 nm. Preferably, the pitch of the peaks or bottoms is larger than the vertical distance between the peak and the bottom, but is at most 25 times the vertical distance. More preferably, the pitch is 4 to 20 times the vertical distance. Specifically, the pitch is preferably 300 to 1000 nm.

In this specification, the vertical distance between the peak and the bottom of the jagged or uneven surface refers to an average value of the distances in the vertical direction between the peaks and the bottoms, while the pitch refers to an average value of the distances between the adjacent two peaks or bottoms which appear in a period of 0.1 to 5 $\mu$m. This uneven surface structure may be determined by image processing of a TEM (transmission electron microscope) photograph of a cross section of the transparent front electrode 12, or surface observation and surface morphology measurement by means of an AFM (interatomic force microscope).

The transparent front electrode 12 having such an uneven surface structure may be formed according to various methods known per se. For example, the uneven surface structure can be formed by imparting unevenness to the surface of the substrate 11 by, e.g., etching the substrate, and then forming a thin transparent front electrode 12 thereon. The surface of the transparent front electrode 12 will follow the uneven surface of the substrate 11, thus becoming uneven.

The thin-film photovoltaic conversion unit 13 is formed on the transparent front electrode 12. The thin-film photovoltaic conversion unit 13 includes a p-type semiconductor layer 131, an i-type semiconductor layer (photovoltaic conversion layer) 132 and an n-type semiconductor layer 133.

The p-type semiconductor layer 131 provided on the transparent front electrode 12 may be made of a p-type silicon-based semiconductor material doped with a p-type impurity such as boron or aluminum. The p-type semiconductor layer 131 may also be made of amorphous silicon, an alloy material such as amorphous silicon carbide or amorphous silicon-germanium, or polycrystalline silicon or microcrystalline silicon partially containing amorphous silicon, or an alloy material thereof. If desired, the crystallinity or the carrier density by the conductivity type-determining impurity atom may be controlled by irradiating the deposited p-type semiconductor layer 131 with pulse laser beam.

The i-type semiconductor layer (photovoltaic conversion layer) 132 formed on the p-type semiconductor layer 131 is composed of a substantially non-doped intrinsic semiconductor material, preferably a silicon-based semiconductor material. The i-type semiconductor layer 132 may be provided by an amorphous silicon thin film, a polycrystalline silicon thin film, a microcrystalline silicon thin film whose volumetric crystallinity is 80% or more, or a silicon-based thin film of weak p-type or weak n-type conductivity containing a minute amount of impurity but having a sufficient photovoltaic conversion function. However, the photovoltaic conversion layer 132 is not limited to these materials, and it may be composed of an alloy material such as silicon carbide or silicon-germanium. Such a photovoltaic conversion layer 132 has a thickness which allows necessary and sufficient photovoltaic conversion. For this purpose, the photovoltaic conversion layer made of an amorphous silicon-based semiconductor material generally has a thickness of 0.3 to 0.4 $\mu$m, while the photovoltaic conversion layer made of a crystalline silicon-based semiconductor material has a thickness of 0.5 to 20 $\mu$m.

The n-type semiconductor 133 formed on the i-type semiconductor 132 may be made of an n-type silicon-based semiconductor material doped with an n-type impurity such as phosphorus or nitrogen. The material of the n-type semiconductor 133 may be amorphous silicon, an alloy material such as silicon carbide or amorphous silicon-germanium. Use may also be made of polycrystalline silicon or microcrystalline silicon partially containing amorphous silicon, or an alloy material thereof. In a preferred embodiment, the n-type semiconductor layer 133 is made of silicon and contains 2 to 8 atomic percent, more preferably 5 to 7 atomic percent of phosphorus, as an n-type impurity, based on the silicon. This amount of phosphorus is larger than conventional. It is preferable that the n-type semiconductor layer 133 containing such a large amount of phosphorus be made of amorphous silicon containing microcrystals. The n-type amorphous silicon layer 133 doped with such a large amount of phosphorus may be formed by plasma CVD wherein silane ($SiH_4$) and phosphine ($PH_3$), for example, are supplied at a flow rate ratio of 100:2–8, preferably 100:5–7.

All semiconductor layers included in the photovoltaic conversion unit 13 may be deposited by plasma CVD at a substrate temperature of 400° C. or less, preferably at a substrate temperatures of 160° C. to 240° C. As the plasma CVD, use may be made of a parallel-plate RF plasma CVD technique, and a plasma CVD technique using a high frequency power source whose frequency is from RF band of 150 MHz or less to VHF band, which are well known per se in the art.

The rear electrode 14 is formed on the photovoltaic conversion unit 13. The rear electrode 14 includes a transparent conductive rear layer 141 comprising zinc oxide, a bonding layer 142 comprising zinc oxide and a light-reflective metallic layer 143 comprising silver. The zinc oxide-based transparent conductive rear layer 141 may contain a dopant such as aluminum. In a preferred embodiment, the zinc oxide transparent conductive rear layer 141 contains aluminum, as a dopant, in an amount of 1 to 5% by weight, more preferably 3 to 5% by weight. Preferably, the transparent conductive rear layer 141 has a thickness of 10 nm to 1 $\mu$m and exhibits a resistivity of $1.5 \times 10^{-3}$ $\Omega$cm or less, more preferably $6 \times 10^{-4}$ to $1 \times 10^{-3}$ $\Omega$cm.

The light-reflective metallic layer 143 can exhibit a high reflectivity of more than 95% with respect to light having a wavelength in the range of 500 to 1200 nm.

The zinc oxide-based transparent conductive rear layer 141 provided on the photovoltaic conversion unit 13 may be formed by a sputtering method, known pre se, using a zinc oxide target which may contain a dopant such as aluminum. In a preferred embodiment, the zinc oxide target contains aluminum, as a dopant, in an amount of 1 to 5% by weight, more preferably 3 to 5% by weight. Sputtering this target forms the zinc oxide-based transparent conductive rear layer 141 containing aluminum in an amount of 1 to 5% by weight, more preferably 3 to 5% by weight.

To produce the thin-film photovoltaic device 10 shown in FIG. 1, the transparent front electrode 12, thin-film photovoltaic device 13 and the zinc oxide-based transparent conductive rear layer 14 are formed successively on the substrate 11. Then, the zinc oxide-based bonding layer 142 and the silver-based reflective metallic layer 143 are formed successively by a method which will be described in detail below.

In the photovoltaic device 10 provided with the photovoltaic conversion unit 13 having the pin junction structure shown in FIG. 1, light to be photovoltaically converted is incident upon the substrate side.

Figure 2:
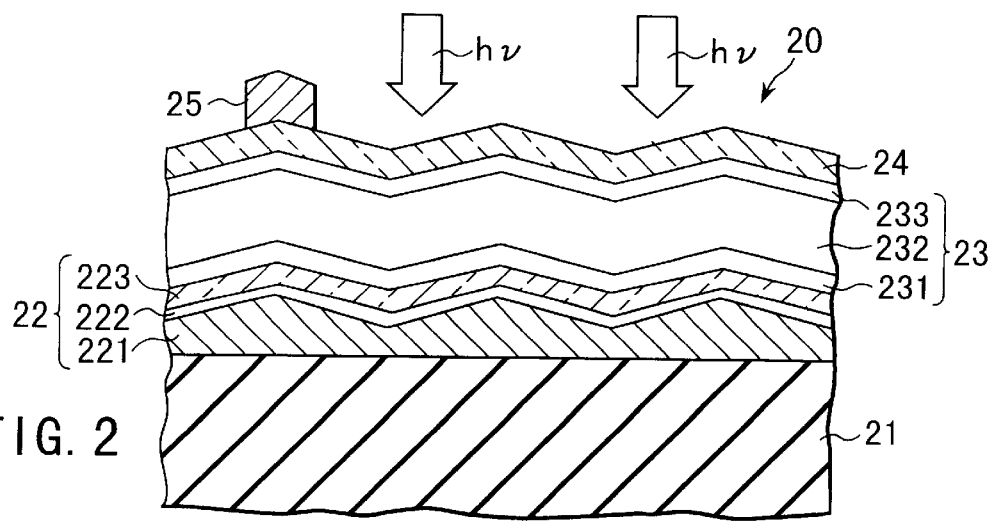
FIG. 2 is a schematic sectional view showing an example of a thin-film photovoltaic device produced according to a second embodiment of the present invention.

A second embodiment of the present invention concerns a method of producing a thin-film photovoltaic device provided with a thin-film photovoltaic conversion unit having an nip junction structure. FIG. 2 shows an example of the thin-film photovoltaic device produced according to the second embodiment of the invention. This thin-film photovoltaic device 20 has, successively formed on an insulating substrate 21, a rear electrode 22, a thin-film photovoltaic conversion unit 23 and a transparent front electrode 24.

The substrate 21 may be made of the same substrate material as the substrate 11 of the photovoltaic device 10 shown in FIG. 1. However, because the substrate 21 does not have to be transparent, it may be formed of metallic material such as stainless steel, surface-coated with an insulating layer.

The rear electrode 22 formed on the substrate 21 corresponds to the rear electrode 14 in FIG. 1. The rear electrode 22 includes a light-reflective metallic layer 221 comprising silver formed on the substrate 21, a bonding layer 222 comprising zinc oxide formed thereon, and a transparent conductive layer 223 comprising zinc oxide formed on the bonding layer 222. The zinc oxide-based transparent conductive layer 223 may be formed in the same manner as for the zinc oxide-based transparent conductive layer 141.

Desirably, the rear electrode 22, particularly the light-reflective metallic layer 221 has an uneven or jagged surface structure (textured surface structure). The uneven surface structure of the light-reflective metallic layer 221 may be formed by processing the surface of the substrate 21 into an uneven surface structure by, e.g., etching the substrate, and then forming a light-reflective metallic layer 221 having such a small thickness that the uneven surface structure of the substrate is transferred to its surface by a method which will be described later. Alternatively, such an uneven surface structure may be obtained by depositing a transparent conductive layer (not shown) having an uneven surface structure on the substrate 21, and then forming a thin light-reflective metallic layer 221 having such a small thickness that the uneven surface structure of the transparent conductive layer is transferred to its surface by a method which will be described later.

The vertical distance between the peak and the bottom in the uneven surface structure of the light-reflective metallic layer 221 is preferably in the range of 0.01 to 2 µm, while the pitch of the peaks or bottoms is preferably larger than the vertical distance but is at most 25 times, more preferably 4 to 20 times the vertical distance. By using the light-reflective metallic layer 221 having such an uneven surface structure, a high performance photovoltaic device can be provided in which the optical confinement effect is enhanced, without accompanied by reductions in the open circuit voltage and in the yield of the devices. The uneven surface structure may be measured by a TEM photography of a cross-section of the rear electrode 22, or by surface observation with an AFM, as described above.

The thin-film photovoltaic conversion unit 23 formed on the rear electrode 22 has the same structure as the photovoltaic conversion unit 13 of the photovoltaic device 10 shown in FIG. 1, except that the disposition of the p-type semiconductor layer 131 and n-type semiconductor layer 133 is inverted. Thus, the photovoltaic conversion unit 23 includes an n-type semiconductor layer 231 corresponding to the n-type semiconductor layer 133 in FIG. 1, a thin-film photovoltaic conversion layer 232 corresponding to the photovoltaic conversion layer 132 in FIG. 1 and a p-type semiconductor layer 233 corresponding to the p-type semiconductor layer 131 in FIG. 1.

The transparent front electrode 24 formed on the photovoltaic conversion unit 23 corresponds to the transparent front electrode 12 in FIG. 1, and may be formed of the same material according to the same method.

Further, a comb-like metallic electrode (grid electrode) 25 is formed on the transparent front electrode 24. The grid electrode 25 is preferably formed of at least one metal selected from Al, Ag, Au, Cu and Pt, or an alloy thereof.

To produce the thin-film photovoltaic device 20 shown in FIG. 2, firstly, the light-reflective metallic layer 221 and the bonding layer 222 are formed on the substrate 21 successively by a method which will be described in detail. Then, the zinc oxide-based transparent conductive rear layer 223, the thin-film photovoltaic conversion unit 23 and the transparent front electrode 24 are formed successively the above-noted methods. Thereafter, the grid electrode 25 is formed by a method known per se in the art.

In the silicon-based thin-film photovoltaic device 20, light to be photovoltaically converted is incident upon the transparent front electrode side.

In order to form the silver-based light-reflective metallic layer 143 or 221, and the bonding layer 142 or 222, which is interposed between the silver-based light-reflective metallic layer 143 or 221 and the transparent conductive rear layer 141 or 223 and which acts to bond them firmly, a first plasma region for forming zinc oxide and a second plasma region for forming silver are generated in a sputter chamber. After these plasma regions are formed, the predetermined substrate is passed over the first plasma region and the second plasma region. As a result, the bonding layer comprising zinc oxide and the light-reflective metallic layer comprising silver are formed. In this way, the rear electrode is produced in which the transparent conductive rear layer and the light-reflective metallic layer are bonded with each other firmly, owing to the bonding layer intervening between them.

In the present invention, the first and second plasma regions are formed in a sputter chamber within which a sputtering gas pressure is set at about 0.1 to about 0.27 Pa. By setting the inside of the sputter chamber at a sputtering gas pressure of 0.27 Pa or less, the bonding strength of the silver-based light-reflective metallic layer with the zinc oxide-based transparent conductive rear layer through the bonding layer is improved. As a result, the silver-based reflective metallic layer can exhibit such a superior bonding strength that it is not peeled from the zinc oxide-based transparent conductive rear layer, even after burning at a high temperature of as high as about 160° C. for 3 hours. Further, by setting the inside of the sputter chamber at a sputtering gas pressure of 0.1 Pa or more, electric discharge during film formation is stabilized so that uniform films or layers can be produced.

In the present invention, it is desirable that the first plasma region and the second plasma region are formed by applying discharge powers to the zinc oxide target which may contain a dopant such as aluminum, and to the silver target. In a preferred embodiment, the zinc oxide target contains, as a dopant, aluminum in an amount of 1 to 5% by weight, more preferably 3 to 5% by weight, as in the target for forming the transparent conductive rear layer noted above. The first and second plasma regions may be formed such that they partially overlap each other to such an extent that the reflectivity of the light-reflective metal formed at the second plasma region is not lowered. This overlapping of the plasma regions may further improve the bonding strength.

Figure 3:
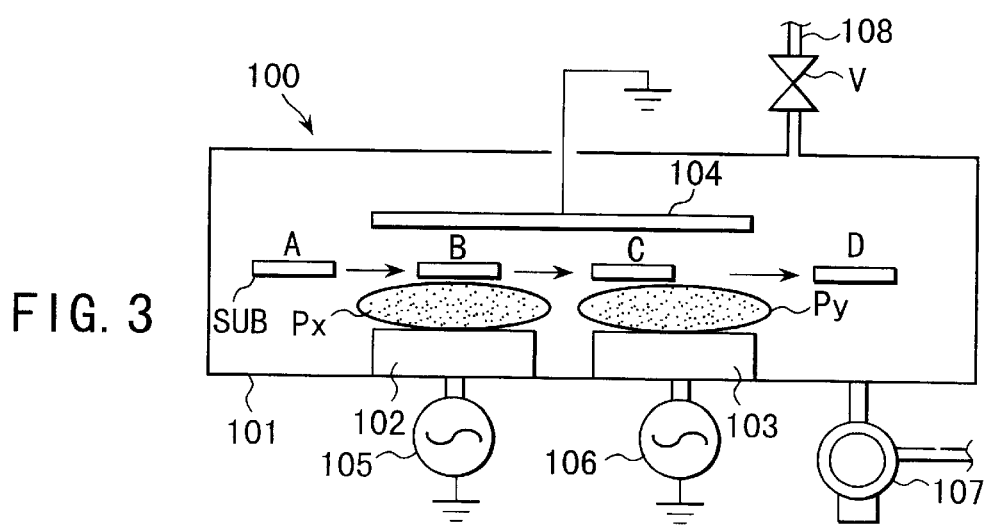
FIG. 3 is a schematic diagram showing an example of a sputtering apparatus which may be used for forming a rear electrode according to the present invention.

Now, a method for forming the silver-based light-reflective metallic layer and the zinc oxide-based bonding layer will be described specifically with reference to FIG. 3. FIG. 3 schematically shows a magnetron type in-line sputtering apparatus 100. In a sputter chamber 101 of the sputtering apparatus 100, two sputter targets, that is, a sputter target 102 (the zinc oxide target which may contain a dopant, or the silver target) and a sputter target 103 (the silver target if the target 102 is the zinc oxide target, or the zinc oxide target which may contain a dopant if the target 102 is the silver target) are disposed. One target 102 is connected to a grounded high-frequency power source 105, while the other target 103 is connected to another grounded high-frequency power source 106. A common opposing electrode 104 is arranged such that it is arranged apart from, and opposes, the two targets 102 and 103. This opposing electrode 104 is grounded. A vacuum pump 107 for evacuating the sputter chamber 101 is connected to the bottom wall of the sputter chamber 101, while a gas inlet pipe 108 having a valve V is connected to the upper wall of the sputter chamber 101. The gas inlet pipe 108 is connected to an inert gas (sputter gas) source (not shown). Needless to say, a magnet (not shown) is provided on the apparatus 100.

To form the silver-based light-reflective metallic layer and the zinc oxide-based bonding layer, the sputter chamber 101 is evacuated by means of the vacuum pump 107 to a high vacuum of, e.g., about $8 \times 10^{-4}$ Pa. Then, the valve V is opened to introduce the sputtering gas, preferably argon gas (Ar), from the gas inlet pipe 108 to a sputter gas pressure of about 0.1 to about 0.27 Pa within the sputter chamber, and this pressure is maintained.

Then, predetermined high-frequency electric powers are supplied from the high frequency power sources 105 and 106 to the two targets 102 and 103, respectively, so as to electrically discharge both the targets. The power density of the discharge power applied to the silver target is preferably about 1 to 20 W/cm$^2$. On the other hand, the power density of the discharge power applied to the zinc oxide target is preferably 0.1 to 4 W/cm$^2$. The bonding strength between the silver-based reflective metallic layer and the zinc oxide-based transparent conductive rear layer does not depend on the power densities of the discharge powers if the power densities are at least within the above-noted ranges, respectively. Further, the bonding strength does not depend on a substrate temperature if the substrate temperature is in the range of ambient temperature (20° C.) to 50° C. during the formation of the silver-based reflective metallic layer and the zinc oxide-based bonding layer.

When the two targets 102 and 103 are electrically discharged in this way, a plasma region Px containing fine particles of the material of the target 102 is formed on the target 102, while a plasma region Py containing fine particles of the material of the target 103 is formed on the target 103. As noted above, an overlapping region of these two plasma regions, i.e., a very weak plasma region may be formed in which the fine particles of both the materials in the two plasmas are mingled.

When a predetermined substrate SUB is moved from a substrate position A upstream of the target 102 to a substrate position D downstream of the target 103, a layer of the material of the target 102 and a layer of the material of the target 103 are continuously formed in succession. At this time, the material of the target 102 is deposited in the vicinity (substrate position B) of the target 102. Then, the substrate SUB is moved from the plasma region Px to the plasma region Py. When the substrate SUB approaches the vicinity (substrate position C) of the target 103, a layer composed of substantially 100% of the material of the target 103 is formed. The substrate SUB can be moved with the substrate mounted on a holder or tray made of metal.

If it is desired to produce a thin-film photovoltaic device having a photovoltaic conversion unit of a pin junction structure as shown in FIG. 1, the substrate 11, on which the rear electrode 12, the photovoltaic conversion unit 13 and the transparent conductive rear layer 141 as shown in FIG. 1 have been formed, is used as the substrate SUB, and the zinc oxide target which may contain a dopant may be used as the sputter target 102 with the silver target used as the sputter target 103. Thus, the bonding layer 142 and the silver-based light-reflective metallic layer 143 are formed successively on the transparent conductive rear layer 141, providing the desired thin-film photovoltaic device. A protective metallic layer made of, e.g., titanium or aluminum may be formed on the silver-based light-reflective metallic layer 143.

If it is desired to produce a thin-film photovoltaic device having a photovoltaic conversion unit of a nip junction structure as shown in FIG. 2, the substrate 21, as it is, is used as the substrate SUB. The silver target may be used as the sputter target 102 with the zinc oxide target which may contain a dopant used as the sputter target 103. Alternatively, the zinc oxide target may be used as the sputter target 102 with the silver target used as the sputter target 103. In this case, the substrate SUB may be moved in a direction opposite to the direction described above with reference to FIG. 3. Thus, the silver-based light-reflective metallic layer 221 and the bonding layer 222 are formed in this order on the substrate 21. Thereafter, the transparent conductive rear layer 223, the photovoltaic conversion unit 23 and the transparent front electrode 24 are formed as described above, and then the grid electrode 25 is formed, providing the desired thin-film photovoltaic device.

In any case, the zinc oxide-based bonding layer is preferably formed to have a thickness of 1 nm to 100 nm, and the silver-based light-reflective metallic layer is preferably formed to have a thickness of 0.1 μm to 0.5 μm. More preferably, the zinc oxide-based bonding layer is formed to have a thickness of 3 nm to 30 nm, and the silver-based reflective metallic layer is formed to have a thickness of 0.2 μm to 0.3 μm.

The transparent conductive rear layer 141 or 223 may be formed using the same sputtering apparatus 100 used for forming the bonding layer 142 or 222 and the light-reflective metallic layer 143 or 221. More specifically, for example, in the sputter chamber 101 in which the zinc oxide target 102 and the silver target 103 are disposed, a discharge power is applied to the zinc oxide target 102 alone to form the transparent conductive rear layer. Then, the substrate SUB is returned to the substrate position A, and the bonding layer and the light-reflective metallic layer may be formed by the above-described method. Alternatively, the power density of the discharge power applied to the zinc oxide target may be changed to a power density required for forming the bonding layer and the discharge power is applied to the silver target to form the bonding layer an then the light-reflective metallic layer as described above. Alternatively, an additional zinc oxide target is provided, and one of the two zinc oxide targets may be used to form the bonding layer, and the other zinc oxide target may be used to form the transparent conductive rear layer. Meanwhile, the plasma region for forming the bonding layer may be formed with induced energy or parasitic discharge generated by the discharge power applied to the silver target to form the plasma region used for forming the reflective metallic layer.

It is, however, preferred in the present invention to form the zinc oxide-based transparent conductive rear layer 141 or 223 by sputtering the zinc oxide target which may contain a dopant under conditions that the substrate temperature is 150° C. or more and a sputtering gas pressure is 1 Pa or more (hereinafter referred to as specified temperature/pressure conditions). The substrate temperature at which the sputtering is conducted is more preferably 160° C. to 240° C., and the sputtering gas pressure is more preferably 1.3 to 2.5 Pa. Further, the power density of the discharge power applied to the zinc oxide target is preferably 4.0 to 6.0 W/cm$^2$.

The C-axis of the crystal of the zinc oxide layer formed by sputtering under the specified temperature/pressure conditions is believed to be oriented uniformly and substantially perpendicular to the surface of the zinc oxide layer. It is noted that the crystal orientation of the zinc oxide crystal is known to depend on, particularly, a sputtering gas pressure (for example, Ar pressure), and the C-axis of the crystal of the zinc oxide layer is thought to be oriented perpendicular to the layer surface under a sputtering gas pressure of 1 Pa or more. A photovoltaic device having the zinc oxide layer whose crystal's C-axis is oriented perpendicular to the layer surface has excellent photovoltaic characteristics such as a fill factor (F.F.). In addition, when the zinc oxide layer, in which the C-axis is oriented perpendicular to the layer surface, is formed on the n-type semiconductor layer, no barrier or semiconductor junction is formed between the zinc oxide layer and the n-type semiconductor layer so that an excellent ohmic contact may be established. Therefore, the formation of the zinc oxide layer by sputtering under the specified temperature/pressure conditions is particularly suitable for producing a photovoltaic device having a photovoltaic conversion unit of a pin junction structure. In this case, even if the photovoltaic conversion unit is formed at the desirable temperature noted above, i.e., at a substrate temperature of 160 to 240° C., the zinc oxide can be formed at a temperature of the substrate which maintains its heated state, contributing to an increase in productivity. The zinc oxide-based transparent conductive rear layer may be composed of two layers, i.e., a first layer formed in the heated state of the substrate, following the formation of the photovoltaic conversion unit, and a second layer formed after the formation of the first layer followed by cooling and washing. In this case, the formation of the zinc oxide layer under the specified temperature/pressure conditions is preferably applied to the formation of the first layer.

The above-mentioned advantages attained when the zinc oxide-based transparent conductive rear layer 141 or 223 is formed by sputtering under the specified temperature/pressure conditions can be obtained also on a photovoltaic device produced without forming the bonding layer and the silver-based light-reflective metallic layer according to the present invention, i.e., a photovoltaic device in which a light-reflective metallic layer is formed by a conventional method, or on a photovoltaic device in which the bonding layer is not formed. In that case, the light-reflective metallic layer may be made of gold, aluminum, copper, platinum or an alloy thereof, though the metallic layer is most preferably made of silver.

Further, in the case where the n-type semiconductor layer 133 or 231 is made of silicon, particularly, amorphous silicon containing microcrystalline silicon and contains phosphorus, as an n-type impurity, in an amount of 2 to 8 atomic percent, more preferably 5 to 7 atomic percent, based on the silicon, as described above, and the transparent conductive rear layer is made of zinc oxide and contains aluminum, as a dopant, in an amount of 1 to 5% by weight, preferably 3 to 5% by weight, as described above (this case is hereinafter referred to as specified n-type silicon/zinc oxide combination), the electric resistance of the transparent conductive rear layer itself may be decreased, and the electric resistance across the n-type semiconductor layer and the transparent conductive rear layer can be reduced, thus making it possible to provide a photovoltaic device having improved photovoltaic characteristics. Meanwhile, these advantages derived from the specified n-type silicon/zinc oxide combination can be obtained also on a photovoltaic device produced without forming the bonding layer and the silver-based light-reflective metallic layer according to the present invention, i.e., a photovoltaic device in which a light-reflective metallic layer is formed by a conventional method, or on a photovoltaic device in which the bonding layer is not formed. In that case, the light-reflective metallic layer may be made of gold, aluminum, copper, platinum or an alloy thereof, though the metallic layer is most preferably made of silver.

Now, the present invention will be described below by way of its Examples. However, the present invention should not be limited to those Examples. Examples 1 to 9, and Comparative Examples 1 to 6

In these Examples, a thin-film photovoltaic device (solar cell) having a structure as shown in FIG. 1 was produced as follows.

A glass substrate coated with a 500 Å-thick silicon oxide ($SiO_2$) film was used as an insulating transparent substrate 11. On the silicon oxide film of the substrate 11, silicon oxide ($SiO_2$) doped with fluorine was deposited to a thickness of about 8000 Å, forming a transparent front electrode 12. Note that the silicon oxide transparent front electrode 12 was formed to have a microscopically uneven (textured) surface structure. Then, a p-type amorphous silicon carbide hydride (a-SiC:H) 131 was formed to a thickness of 150 Å, an i-type amorphous silicon hydride (a-Si:H) 132 to a thickness of 4000 Å, and an n-type microcrystalline silicon hydride ($\mu$c-Si:H) 133 to a thickness of 500 Å, on the transparent front electrode 12 successively by plasma CVD, thus forming a thin-film photovoltaic conversion unit 13.

Subsequently, the substrate SUB, on which up to the thin-film photovoltaic conversion unit 13 has been formed, was set at the substrate position A in the sputter chamber 101 of the magnetron type in-line sputtering apparatus 100 as shown in FIG. 3. Then, the sputter chamber 101 was evacuated to $8 \times 10^{-4}$ Pa by means of the vacuum pump 107. Thereafter, argon gas was introduced through the gas inlet pipe 108 to a pressure as indicated in Table 1 below within the chamber. Then, while the substrate SUB was moved, the zinc oxide target 102 (containing 5% by weight of aluminum as a dopant in the form of aluminum oxide ($Al_2O_3$)) was sputtered at a high-frequency power density of 0.8 W/cm$^2$ to form a transparent conductive rear layer 141 having a thickness of 800 Å on the photovoltaic conversion unit 13 (substrate position B). The distance between the ZnO target 102 and the substrate SUB was about 5 cm. Note that, although the silver target 103 was disposed near the zinc oxide target 102 in the sputtering apparatus 100 as shown in FIG. 3, the silver target 103 was not electrically discharged during the formation of the transparent conductive rear layer 141.

Next, the substrate SUB, in which the transparent conductive rear layer 141 has been formed, was returned to the substrate position A. Then, high frequency powers at densities shown in Table 1 were applied to the zinc oxide target 102 and silver target 103, respectively, to discharge both the targets. Thereafter, the substrate SUB set at a temperature shown in Table 1 was moved from the substrate position A to the substrate position D. Thus, the bonding layer 142 and the light-reflective metallic layer 143 were formed successively. The thickness of the bonding layer was 30 nm, while the thickness of the light-reflective metallic layer 143 was 0.25 $\mu$m.

The photovoltaic device (solar cell) thus produced was investigated for the bonding strength of the rear electrode by an adhesive tape peeling test. Specifically, an adhesive tape (cellophane adhesive tape or gum tape) was applied on the substrate over the exposed surface of the substrate and the silver-based reflective metallic layer, and then the tape was peeled from the glass substrate. The bonding strength was evaluated based on the following criteria.

A: the silver-based light-reflective metallic layer was not peeled off even after it was allowed to stand at 160°.

B: the silver-based reflective metallic layer was peeled off in the peeling test after heated at 160° C. for three hours, though it was not peeled off in the cellophane adhesive tape peeling test just after it was formed.

C: the silver-based reflective metallic layer was peeled off in the cellophane adhesive tape peeling test even just after it was formed.

The results are shown also in Table 1.

TABLE 1

| | Film Formation Conditions | | | |
|---|---|---|---|---|
| Ar Gas Pressure (Pa) | Power Density (ZnO Target) (W/cm$^2$) | Power Density (Ag Target) (W/cm$^2$) | Substrate Temp. | Pealing Test Result |
| Ex. 1 | 0.10 | 3.9 | 8.8 | Room Temp. | A |
| Ex. 2 | 0.13 | 3.9 | 8.8 | Room Temp. | A |
| Ex. 3 | 0.20 | 3.9 | 8.8 | Room Temp. | A |
| Ex. 4 | 0.27 | 2.6 | 7.3 | Room Temp. | A |
| Ex. 5 | 0.27 | 1.1 | 2.4 | Room Temp. | A |
| Ex. 6 | 0.27 | 1.1 | 2.4 | Room Temp. | A |
| Ex. 7 | 0.27 | 0.45 | 1.0 | Room Temp. | A |
| Ex. 8 | 0.27 | 0.40 | 8.8 | Room Temp. | A |
| Ex. 9 | 0.27 | 2.6 | 7.3 | 50° C. | A |
| Comp. Ex. 1 | 0.40 | 2.6 | 7.3 | 50° C. | B |
| Comp. Ex. 2 | 0.53 | 1.6 | 4.7 | Room Temp. to 80° C. | B |
| Comp. Ex. 3 | 0.67 | 3.9 | 7.3 | 50° C. | C |
| Comp. Ex. 4 | 0.67 | 1.9 | 7.3 | 50° C. | C |
| Comp. Ex. 5 | 0.67 | 1.6 | 7.3 | 50° C. | C |
| Comp. Ex. 6 | 0.67 | 3.0 | 5.8 | 50° C. | C |

As is evident from Table 1, according to the present invention, a thin-film photovoltaic device can be produced which has a rear electrode including a silver-based reflective metallic layer that is not peeled off even if it is heated to a high temperature.

EXAMPLE I

An amorphous silicon-based photovoltaic device having a structure shown in FIG. 1, but having no bonding layer, was produced in the following manner.

A transparent front electrode 12 composed of SnO$_2$ was formed on a glass substrate 11. An amorphous silicon-based photovoltaic conversion unit 13 including a p-type layer 131, an i-type layer 132 and an n-type layer 133 was formed on the transparent front electrode 12 by plasma CVD. Of these layers, the n-type layer 133 was formed at a substrate temperature of 185° C. by plasma CVD while supplying hydrogen-diluted SiH$_4$ and PH$_3$ at a flow rate ratio of 100:6.

Subsequently, a 60 nm-thick zinc oxide layer (first zinc oxide layer) was formed on the photovoltaic conversion unit 13 without cooling the substrate. Specifically, the zinc oxide layer was formed by sputtering under the following conditions, using ZnO as a target.

Substrate temperature: 185° C.

Discharge power density: 4.0 W/cm$^2$

Sputtering gas (Ar) pressure: 2.0 Pa

Next, the substrate was cooled, and the surface of the zinc oxide layer was washed. Then, a second zinc oxide layer was formed by sputtering under the following conditions.

Substrate temperature: 50° C.

Discharge power density: 4.0 W/cm$^2$

Sputtering gas (Ar) pressure: 0.5 Pa

The thickness of this second zinc oxide layer was 30 nm. Thus, a zinc oxide transparent conductive rear layer 141 having a total thickness of 90 nm was formed.

Further, a metallic layer 142 made of Ag was formed by sputtering on the transparent conductive rear layer 141, giving a rear electrode 14 comprised of the transparent conductive rear layer 141 and the metallic layer 142, providing a photovoltaic device.

Figure 4:
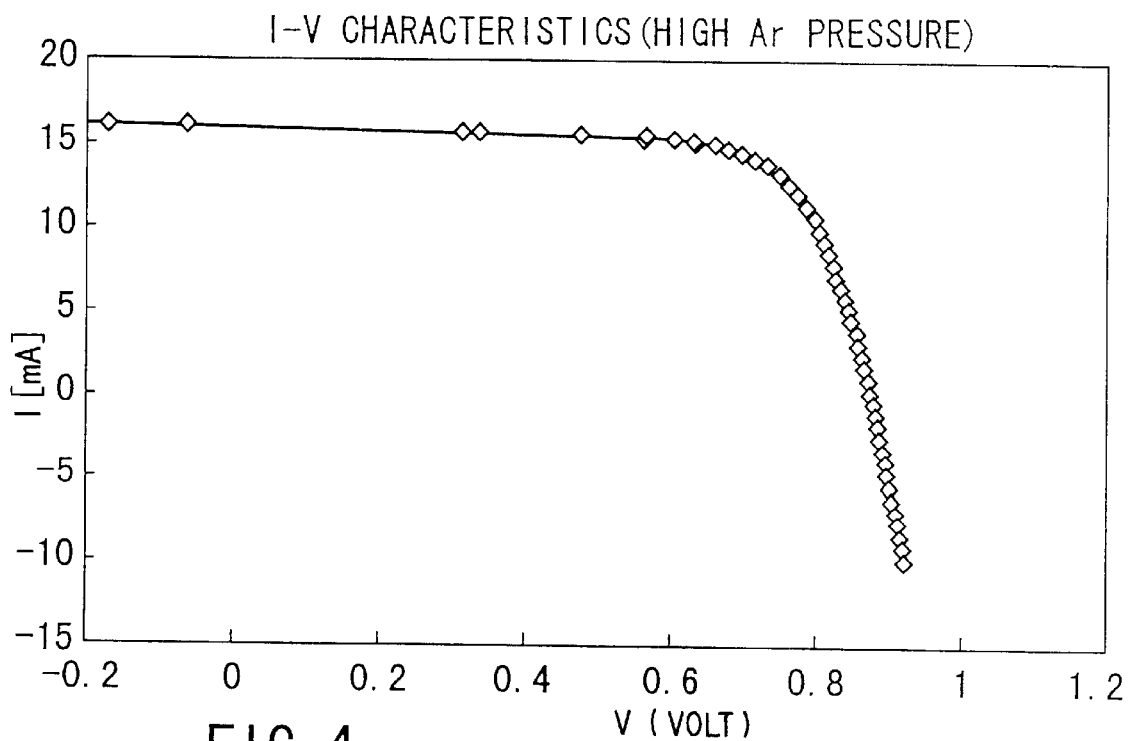
FIG. 4 shows an I–V characteristic curve of a thin-film photovoltaic device produced in an Example of the present invention.

The photovoltaic device thus produced was measured for its I–V characteristics, giving an excellent I–V curve as shown in FIG. 4. Further, the fill factor (FF) of a 1 cm-square cell of the device was found to be as high as 74.4%.

EXAMPLE II

A photovoltaic device was produced in the same manner as in Example I, except that the first zinc oxide was formed at a sputtering gas pressure of 0.5 Pa.

Figure 5:
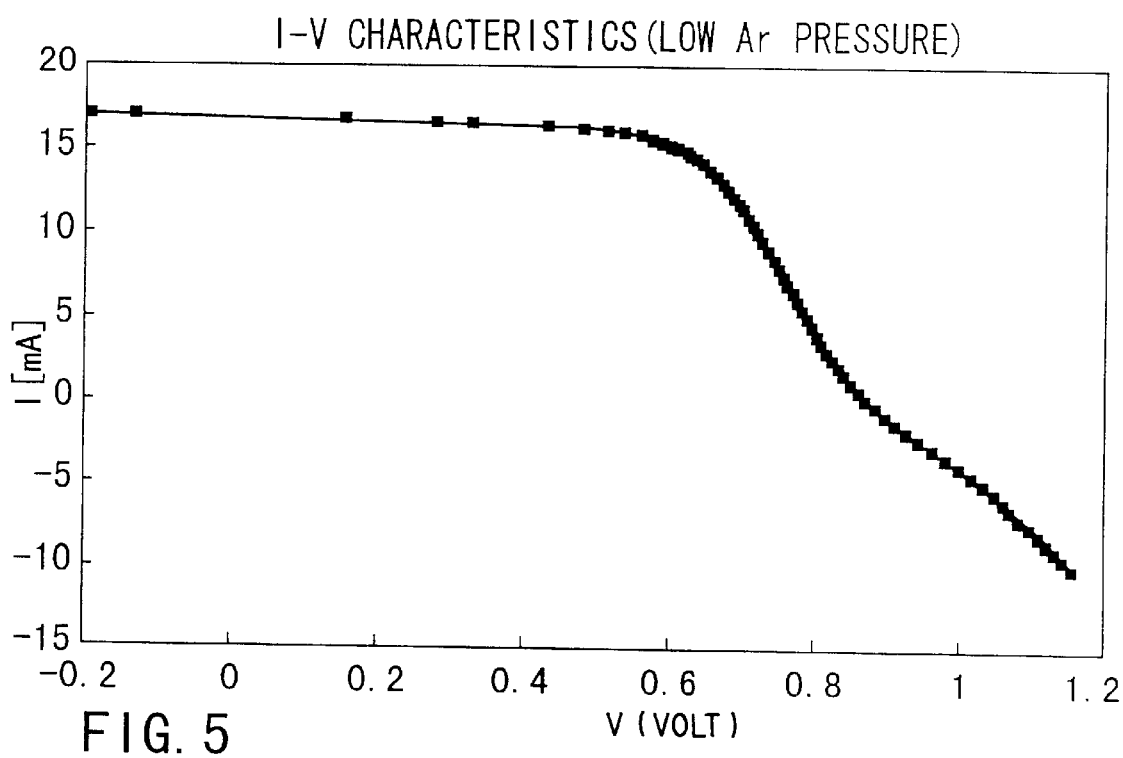
FIG. 5 shows an I–V characteristic curve of the thin-film photovoltaic device produced in another Example.

The photovoltaic device thus produced was measured for its I–V characteristics, giving an I–V curve as shown in FIG. 5. As is evident from the comparison between FIGS. 4 and 5, the I–V characteristics are superior on the device of Example I to on the device of Example II. Further, the FF of a 1 cm-square cell of the device prepared in Example II was found to be 63.8%.

EXAMPLE III

An amorphous silicon-based thin-film photovoltaic device having a structure shown in FIG. 1, but having no bonding layer was produced as follows.

First, a transparent front electrode 12 composed of SnO$_2$ was formed on the glass substrate 11. Then, an amorphous silicon-based photovoltaic conversion unit including a p-type layer 131, an i-type layer 132 and an n-type layer 133 was formed On the front electrode 12 by plasma CVD. Of these layers, the n-type layer 133 was formed by plasma CVD while supplying hydrogen-diluted SiH$_4$ and PH$_3$ at a flow rate ratio of 100:6. Then, a transparent conductive rear layer 141 made of aluminum-doped zinc oxide was formed to a thickness of 90 nm on the photovoltaic conversion unit 13. Specifically, the transparent conductive rear layer 141 was formed by sputtering, using a zinc oxide target doped with 3% by weight of Al$_2$O$_3$. Further, a metallic layer 143 made of Ag was formed by sputtering, thus providing the photovoltaic device.

The photovoltaic device thus prepared was found to exhibit a photovoltaic conversion efficiency of 10.8% when light of AM 1.5 was projected thereon in a light amount of 100 mW/cm$^2$.

EXAMPLE IV

The photovoltaic device was produced in the same manner as in Example III, except that the n-type layer 133 was formed plasma CVD while supplying hydrogen-diluted SiH$_4$ and PH$_3$ at a flow rate ratio of 100:1 and that a zinc oxide target doped with 2% by weight of Al$_2$O$_3$ was used to form the transparent conductive rear layer 141 made of aluminum-doped zinc oxide.

The photovoltaic device thus prepared was found to exhibit a photovoltaic conversion efficiency of 10.2%, a value smaller than Example III, when light of AM 1.5 was projected thereon in a light amount of 100 mW/cm$^2$.

The comparison between Examples III and IV reveals that a thin-film photovoltaic device having improved photovoltaic characteristics can be obtained by reducing an interface resistance between the thin-film photovoltaic conversion unit and transparent conductive rear layer.

From the above Examples, it may be readily understood by those skilled in the art that a photovoltaic device having more excellent photovoltaic characteristics can be obtained, if the formation of the bonding layer and the silver-based light-reflective metallic layer according to the present invention is combined with the formation of the transparent conductive rear layer under the specified temperature/pressure conditions and/or with the specified n-type silicon/zinc oxide combination.

The present invention can be applied to so-called tandem type photovoltaic devices or integrated type photovoltaic devices, in addition to the thin-film photovoltaic device having one pin junction structure or nip junction structure noted above.

As described above, according to the present invention, there is provided a method that can produce a thin-film photovoltaic device provided with a rear electrode including a silver-based light-reflective metallic layer exhibiting an excellent bonding strength such that it is peeled even if heated to a high temperature.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of producing a thin-film photovoltaic device, comprising:

successively providing a transparent front electrode on a substrate and a thin-film photovoltaic conversion unit in the rear of said transparent front electrode; and providing a rear electrode comprising a transparent conductive rear layer comprising zinc oxide, a bonding layer comprising zinc oxide, and a light-reflective metallic layer comprising silver, wherein the step of providing a rear electrode comprises the steps of:

(a) providing, in the rear of said photovoltaic conversion unit, the transparent conductive rear layer, wherein said transparent conductive rear layer is formed by non-reactive sputtering a zinc oxide target at a substrate temperature of 150° C. or more and a sputtering gas pressure of 1 Pa or more; and (b) forming the bonding layer and the light-reflective metallic layer, in the rear of the transparent conductive rear layer, by providing a first plasma region comprising fine particles of zinc oxide by non-reactive sputtering a zinc oxide sputter target and applying a discharge power to the zinc oxide sputter target at a sputtering gas pressure of about 0.1 to about 0.27 Pa, and providing a second plasma region comprising fine particles of silver by applying a discharge power to a silver sputter target, at a sputtering gas pressure of about 0.1 to about 0.27 Pa, in a chamber, wherein the substrate passes over said first plasma region and the second plasma regions formed in said chamber.

2. The method according to claim 1, wherein said bonding layer is formed to have a thickness of from 1 nm to 100 nm.

3. The method according to claim 1, wherein a power density of said discharge power applied to said zinc oxide sputter target is about 0.1 to about 4 W/cm$^2$, and the power density of the discharge power applied to said silver sputter target is about 1 to about 20 W/cm$^2$.

4. The method according to claim 1, wherein said first plasma region and said second plasma region are formed such that they partially overlap each other.

5. The method according to claim 1, wherein a C-axis of the zinc oxide crystal of said transparent conductive rear layer is oriented substantially perpendicular to the surface of said transparent conductive rear layer.

6. The method according to claim 1, wherein said photovoltaic conversion unit has an n-type semiconductor layer comprising silicon and containing phosphorus, as an impurity, in an amount of 2 to 8 atomic percent based on said silicon, and said transparent conductive rear layer comprises zinc oxide and contains aluminum in an amount of 1 to 5% by weight.

7. The method according to claim 6, wherein said n-type semiconductor layer comprises amorphous silicon including microcrystalline silicon.

8. The method according to claim 7, wherein said n-type semiconductor layer comprises amorphous silicon including microcrystalline silicon.

* * * * *